United States Patent
Lee et al.

(10) Patent No.: US 9,035,280 B2
(45) Date of Patent: May 19, 2015

(54) LIGHT-EMITTING DEVICE

(71) Applicant: EPISTAR CORPORATION, Hsinchu (TW)

(72) Inventors: Rong-Ren Lee, Hsinchu (TW); Chien-Fu Huang, Hsinchu (TW); Shih-Chang Lee, Hsinchu (TW); Yi-Ming Chen, Hsinchu (TW); Shiuan-Leh Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 13/970,949

(22) Filed: Aug. 20, 2013

(65) Prior Publication Data

US 2014/0048768 A1 Feb. 20, 2014

(30) Foreign Application Priority Data

Aug. 20, 2012 (TW) .............................. 101130205 A

(51) Int. Cl.
*H01L 33/06* (2010.01)
*H01L 33/04* (2010.01)

(52) U.S. Cl.
CPC ................ *H01L 33/04* (2013.01); *H01L 33/06* (2013.01)

(58) Field of Classification Search
USPC ............................. 257/13; 438/22, 37, 46, 47
See application file for complete search history.

(56) References Cited

U.S. PATENT DOCUMENTS 6,924,512 B2 * 8/2005 Tsuda et al. .................... 257/97

* cited by examiner

*Primary Examiner* — Daniel Shook
(74) *Attorney, Agent, or Firm* — Ditthavong & Steiner, P.C.

(57) ABSTRACT

A light-emitting device disclosed herein comprises a substrate, an active layer formed on the substrate and including a first quantum well, a second quantum well and a barrier layer disposed between the first quantum well and the second quantum well. The barrier layer includes a first region adjacent to the first quantum well, a third region adjacent to the second quantum well and a second region disposed between the first region and the third region and comprising Sb.

14 Claims, 6 Drawing Sheets

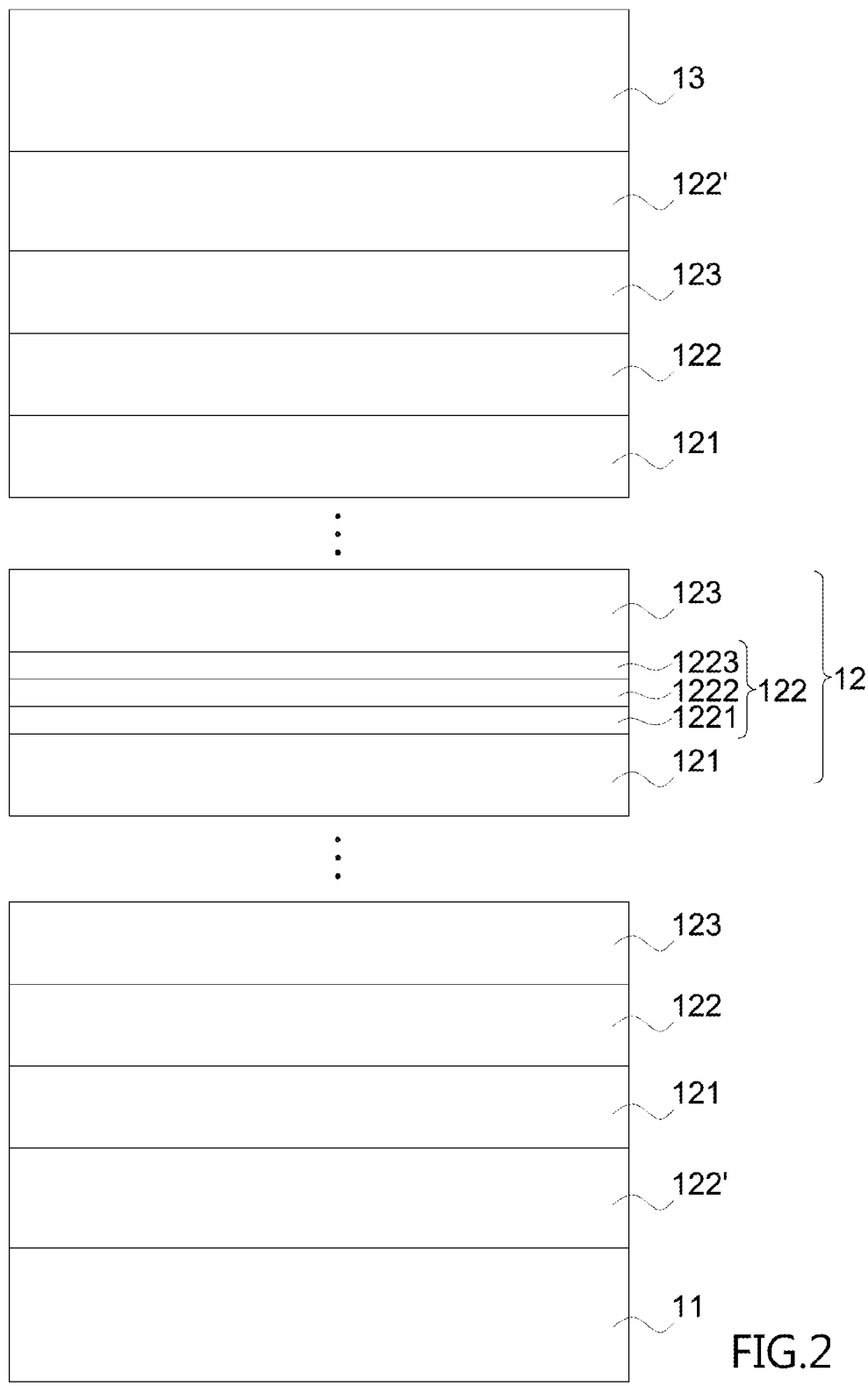

LIGHT-EMITTING DEVICE

CROSS-REFERENCE TO RELATED APPLICATION

This application claims the priority benefit of Taiwan application Ser. No. 101130205, filed Aug. 20, 2012. The entirety of the above-mentioned patent application is hereby incorporated by reference in its entirety and made a part of this specification.

TECHNICAL FIELD

This present application relates to a light-emitting device, and more particularly to a light-emitting device having a barrier layer with Sb.

BACKGROUND OF THE DISCLOSURE

The light-emitting diodes (LEDs) of the solid-state lighting elements have the characteristics of low power consumption, low heat generation, long operational life, shockproof, small volume, quick response and good opto-electrical property like light emission with a stable wavelength, so the LEDs have been widely used in household appliances, indicator light of instruments, and opto-electrical products, etc.

Generally, the luminous intensity of the LEDs decreases with the increase of temperature, and the reduced level of the brightness depends on the materials. How to solve this problem is an important issue.

In addition, the LEDs can be further connected to other components in order to form light emitting apparatus, such as bulbs. The light emitting device comprises a sub-mount with a circuit layout, a solder disposed on the sub-mount and an electrical structure electrically connected to an electrode of the LED and the circuit layout of the sub-mount, wherein the LED is fixed on the sub-mount via a solder, and then the substrate of the LED is electrically connected to the sub-mount. The sub-mount may be a lead frame or a large mounting substrate to facilitate the circuit design and increase the heat dissipation.

SUMMARY OF THE DISCLOSURE

A light-emitting device comprises a substrate, an active layer formed on the substrate and including a first quantum well, a second quantum well and a barrier layer disposed between the first quantum well and the second quantum well. The barrier layer includes a first region adjacent to the first quantum well, a third region adjacent to the second quantum well and a second region disposed between the first region and the second region and comprising Sb.

BRIEF DESCRIPTION OF THE DRAWINGS

FIG. 2 shows a cross-section of an active layer in accordance with one embodiment of the present disclosure.

DETAILED DESCRIPTION OF THE PREFERRED EMBODIMENTS

Figure 1:
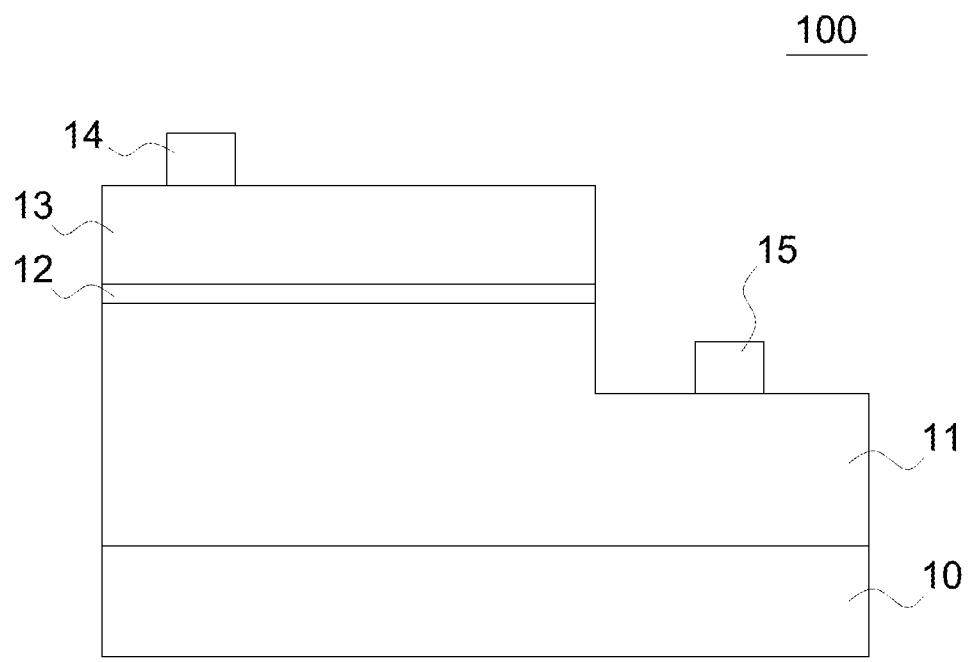
FIG. 1 shows a cross-section of a light-emitting device in accordance with one embodiment of the present disclosure.

FIG. 1 shows a light-emitting device (LED) in accordance with one embodiment of the present disclosure. The LED 100 comprises a substrate 10, a first semiconductor layer 11, an active layer 12 formed on the first semiconductor layer 11 and a second semiconductor layer 13 formed on the active layer 12. The LED 100 further comprises a first electrode 15 formed on the first semiconductor layer 11 and a second electrode 14 formed on the second semiconductor layer 13. In the embodiment, the LED 100 is a horizontal structure, but it can be a vertical structure or other different structure as well.

The active layer 12 is a multi-quantum-well (MQW) structure comprising a plurality of quantum wells and barrier layers, wherein the quantum wells and barrier layers are arranged alternately. As shown in FIG. 2, the active layer 12 comprises a first quantum well 121, a second quantum well 123, and a barrier layer 122 disposed between the first quantum well 121 and the second quantum well 123 and including a first resign 1221, a second resign 1222, and a third resign 1223. The first resign 1221 is adjacent to and directly contact with the first quantum well 121. The third resign 1223 is adjacent to and directly contact with the second quantum well 123. The second region 1222 is disposed between the first region 1221 and the third region 1223 and comprises Sb, wherein a concentration of Sb is between $10^{17}$-$10^{20}$cm$^{-3}$. Only one barrier layer comprising the first region 1221, the second region 1222, and the third region 1223 is shown in FIG. 2. In the embodiment, a plurality of barrier layers 122 comprises the first region 1221, the second region 1222, and the third region 1223. The barrier layer 122' directly contacts with the first semiconductor layer 11 and does not comprise Sb, wherein a thickness of the barrier layer 122' is larger than that of the barrier layer 122. The barrier layer 122' directly contacts with the second semiconductor layer 13 and does not comprise Sb, wherein a thickness of the barrier layer 122' is larger than that of the barrier layer 122. Moreover, in the embodiment, only the second region of the barrier layer comprises Sb. However, any of the first region, second region or third region may comprise Sb. For example, the first region comprises Sb, but the second region and the third region do not comprise Sb; the second region and the third region comprise Sb, but the first region does not comprise Sb; or all of the first region, the second region, and the third region comprise Sb. In the embodiment, Sb of the barrier layer may raise the conductor band of the barrier layer, and the electrons are confined in quantum wells to improve the probability of the electron-hole combination when the temperature is increased. Thus, the brightness of the LED would not decease with the increase of the temperature. The barrier layer may comprise P, As, or Bi.

In the embodiment, a material of the first region 1221 and the third region 1223 of the barrier layer 122 is AlGaInP and a material of the second region 1222 of the barrier layer 122 is AlGaInPSb, wherein a mole content ratio of Sb and P is less than 1/10000. In another embodiment, a material of the first region 1221 and the third region 1223 is AlGaAs and a material of the second region 1222 is InGaP. Moreover, a thickness d of the second region 1222 is between 40 Å and 120 Å and a thickness D of the barrier layer 122 is between 170 Å and 190 Å, wherein d/D is between 0.2-0.75. The barrier layer 122 is a single layer, which means there is no interface between the first region 1221 and the second region 1222 and between the second region 1222 and third region 1223.

Figure 3A:
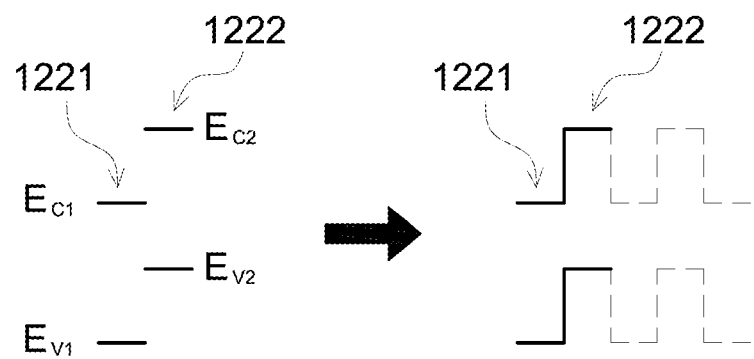
FIGS. 3A and 3B show a diagram of a type II heterojunction.
Figure 3B:
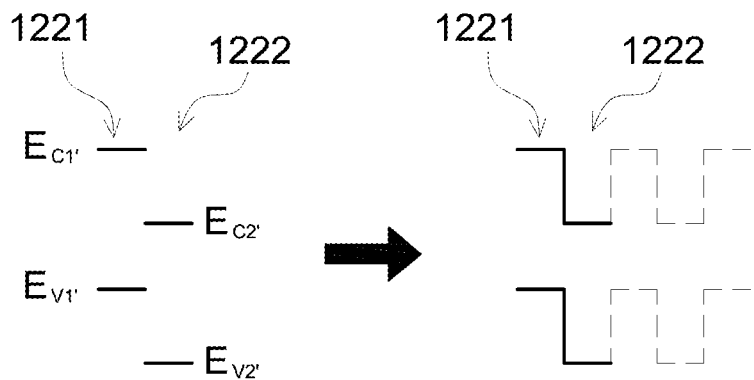

In the embodiment, an energy band of the first region 1221 and the second region 1222 of the barrier layer 122 is a type II heterojunction, and an energy band of the third region 1223 and the second region 1222 of the barrier layer 122 is the type II heterojunction, as shown in FIGS. 3A and 3B. Furthermore, an energy band of the first region 1221 of the barrier layer 122 and the first quantum well 121 is a type I heterojunction, and an energy band of the third region 1223 of the barrier layer 122 and the second quantum well 123 is the type I heterojunction, as shown in FIGS. 4A and 4B.

The type II heterojunction shows a band gap of the first region 1221 (or the third region 1223) partially overlaps a band gap of the second region 1222, which means the conductor band ($E_{C2}$) of the second region 1222 is higher than the conductor band ($E_{C1}$) of the first region 1221 (or third region 1223), the valence band ($E_{V2}$) of the second region 1222 is higher than the valence band ($E_{V1}$) of the first region 1221 (or the third region 1223), and the valence band ($E_{V2}$) of the second region 1222 is lower than the conductor band ($E_{C1}$) of the first region 1221 (or the third region 1223), as shown in FIG. 3A. The type II heterojunction also shows the conductor band ($E_{C1'}$) of the first region 1221 (or third region 1223) is higher than the conductor band ($E_{C2'}$) of the second region 1222, the valence band ($E_{V1'}$) of the first region 1221 (or the third region 1223) is higher than the valence band ($E_{V2'}$) of the second region 1222, and the valence band ($E_{V1'}$) of the first region 1221 (or the third region 1223) is lower than the conductor band ($E_{C2'}$) of the second region 1222.

Figure 4A:
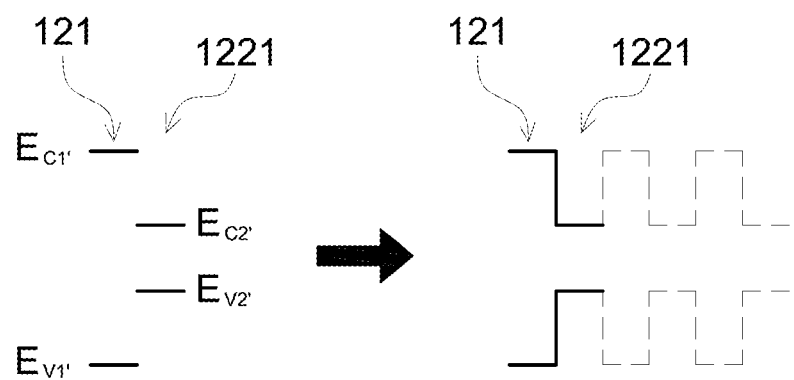
FIGS. 4A and 4B show a diagram of a type I heterojunction.
Figure 4B:
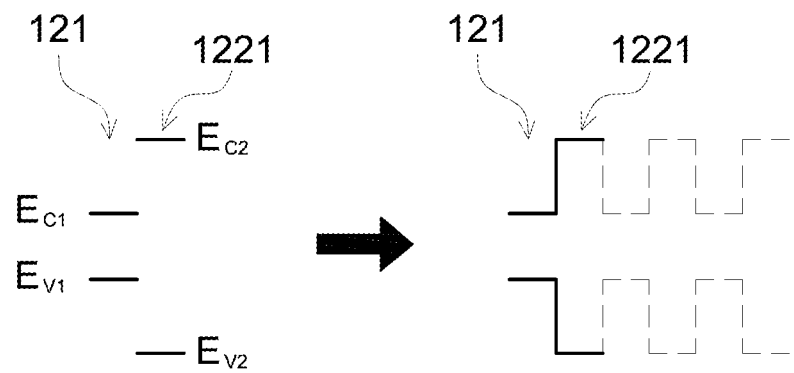

The type I heterojunction shows a band gap of the first region 1221 (or third region 1223) completely overlaps a band gap of the first quantum well 121 (or the second quantum well 123), which means the conductor band ($E_{C1'}$) of the first quantum well 121 (or the second quantum well 123) is higher than the conductor band ($E_{C2'}$) of the first region 1221 (or third region 1223), the valence band ($E_{V1'}$) of the first quantum well 121 (or the second quantum well 123) is lower than the valence band ($E_{V2'}$) of the first region 1221 (or the third region 1223), as shown in FIG. 4A. The type I heterojunction also shows the conductor band ($E_{C2}$) of the first region 1221 (or third region 1223) is higher than the conductor band ($E_{C1}$) of the first quantum well 121 (or the second quantum well 123), the valence band ($E_{V2}$) of the first region 1221 (or the third region 1223) is lower than the valence band ($E_{V1}$) of the first quantum well 121 (or the second quantum well 123), as shown in FIG. 4B.

The first semiconductor layer 11 may be an n-type semiconductor layer and comprises a material such as AlGaAs, AlGaInP, AlInP, and InGaP, or AlInGaN, InGaN, AlGaN, and GaN. The barrier layer 122 comprises a material like AlGaAs, AlInGaP, InGaP and AlInP, or AlInGaN, InGaN, AlGaN, and GaN. The quantum wells 121, 123 comprise a material like AlGaAs, AlInGaP, InGaP and AlInP, or AlInGaN, InGaN, AlGaN and GaN. The first semiconductor layer 11 may be a p-type semiconductor layer and comprises AlGaAs, AlGaInP, AlInP and InGaP, or AlInGaN, InGaN, AlGaN and GaN. The substrate 10 comprises a material like GaAs, GaP, Ge, sapphire, glass, diamond, SiC, Si, GaN, ZnO or other replaceable materials.

Figure 5A:
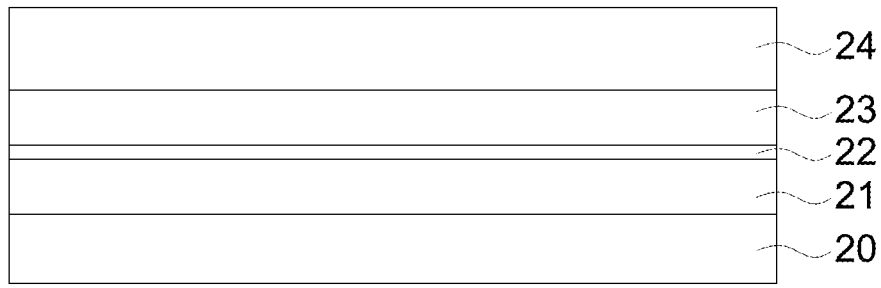
FIGS. 5A-5C show a cross-section of a fabricating method of a light-emitting device in accordance with the embodiments of the present disclosure.
Figure 5B:
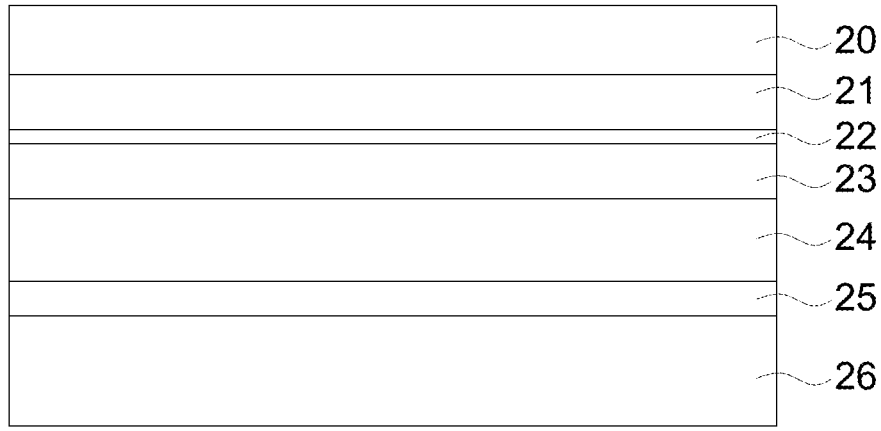
Figure 5C:
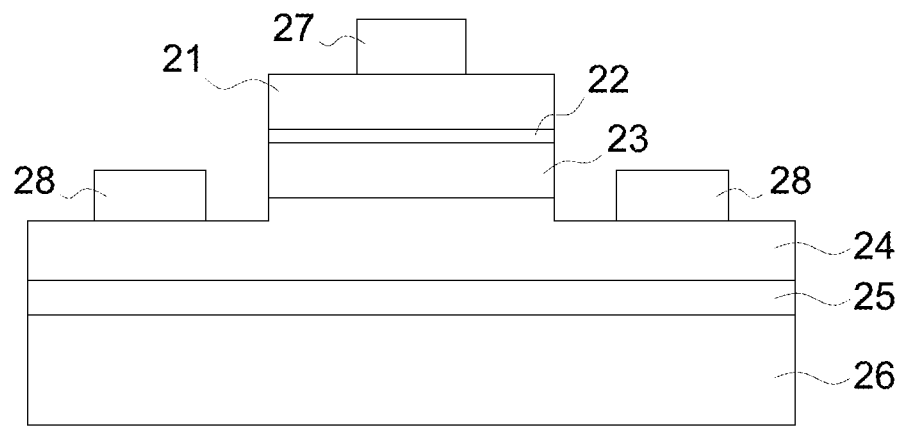

In the first embodiment, a multi-layer comprises an n-type AlInP layer 21, an active layer 22 which is a multi-quantum-well and a p-type AlInP layer 23, as shown in FIG. 5A. The n-type semiconductor layer 21, the p-type semiconductor layer 23 and the active layer 22 are grown on the growth substrate 20 in sequence. The growth substrate can be GaAs substrate. A GaP window layer 24 is grown on the p-type semiconductor layer 23. As shown in 5B, the multi-layer is bonded to the permanent substrate 26 via a bonding layer 25 and then the growth substrate 20 is removed. As shown in FIG. 5C, a partial multi-layer is removed by etching to expose the semiconductor window layer 24. Then, an n-side electrode 27 is formed on the n-type semiconductor layer 21 and a p-side electrode 28 is formed on the semiconductor window layer 24. In this embodiment, the active layer 22 comprises a plurality of quantum wells and barrier layers arranged alternately. Every barrier layer 122 comprises the first AlGaInP region 1221, the second AlGaInPSb region 1222, and the third AlGaInP region 1223 except that the barrier layer 122', which is directly contact with the n-type semiconductor layer 21 and the p-type semiconductor layer 23 does not comprise Sb. In the process of growing the barrier layer 122, firstly, $PH_3$, TMGa, TMAl and TMIn are injected to grow the first AlGaInP region 1221. Secondly, TMSb is injected to mix with the original reactants which are $PH_3$, TMGa, TMAl and TMIn and then the second AlGaInPSb region 1222 is grown. Finally, $PH_3$, TMGa, TMAl and TMIn are injected to grow the third AlGaInP region. In this embodiment, a thickness of the second AlGaInPSb region 1222 is 40 Å, and a thickness of every barrier layer is 190 Å. The permanent substrate 26 is sapphire, and the bonding layer 25 is a $Al_2O_3/SiO_x$ bilayer structure.

In the second embodiment, the LED structure of the second embodiment is similar to that of the first embodiment, except that a thickness of the second region of every barrier layer is 80 Å.

In the third embodiment, the LED structure of the third embodiment is similar to that of the first embodiment, except that a thickness of the second region of every barrier layer is 120 Å.

In the compared embodiment, the LED structure of the compared embodiment is similar to that of the first embodiment, except that the AlGaInP barrier layer is grown without TMSb in the process of growing the barrier layer.

Table 1 shows the experimental result indicating that the LED has a first luminance $L_1$ at a first temperature $T_1$ and a second luminance $L_2$ at a second temperature $T_2$, wherein the first temperature is between 20-40° C., the second temperature is between 50-100° C., and the second luminance is less than the first luminance. In the embodiments, a temperature coefficient $Tc=\{[(L_2 \times 100)/L_1]-100\}/(T_2-T_1)$ and the temperature coefficient Tc is between −0.6%~0.75%. A thickness of the barrier layer is between 50 Å~250 Å.

The temperature coefficient Tc of the LED of the first embodiment, the second embodiment and the third embodiment is more than that of the compared embodiment, which means electrons are confined effectively by adding Sb into the specific region of the barrier layer to enhance the probability of the electron-hole combination. Thus, in the first embodiment, the second embodiment and the third embodiment, the situation which the brightness of LEDs decease with the increase of the temperature can be improved. Furthermore, the experimental result also shows that temperature coefficient Tc is preferable when the thickness of the second region of the barrier layer is 80 Å.

It should be noted that the proposed various embodiments are not for the purpose to limit the scope of the disclosure. Any possible modifications without departing from the spirit of the disclosure may be made and should be covered by the disclosure.

TABLE 1

| | Brightness (mcd) | | |
|---|---|---|---|
| | 25° C. | 100° C. | Temperature Coefficient (Tc) |
| First Embodiment | 1037.8 | 521.4 | −0.68% |
| Second Embodiment | 651.48 | 344.83 | −0.64% |
| Third Embodiment | 926.6 | 482.5 | −0.66% |
| Compared Embodiment | 998 | 426.12 | −0.78% |

The invention claimed is:

1. A light-emitting device, comprising:
   a substrate; and
   an active layer formed on the substrate and including a first quantum well, a second quantum well and a barrier layer disposed between the first quantum well, and the second quantum well;
   wherein the barrier layer includes a first region adjacent to the first quantum well, a third region adjacent to the second quantum well, and a second region disposed between the first region and the third region and comprising Sb, wherein at least one of the first region and the third region comprises a lower concentration of Sb than the second region.

2. The light-emitting device according to claim 1, wherein the barrier layer is a single layer.

3. The light-emitting device according to claim 1, wherein the second region has a thickness d, the barrier layer has a thickness D, and d/D is between 0.2-0.64.

4. The light-emitting device according to claim 1, wherein the first region includes AlGaInP and the second region includes AlGaInPSb.

5. The light-emitting device according to claim 4, wherein a content ratio of Sb to P in the second region is less than $1/10000$.

6. The light-emitting device according to claim 1, wherein a concentration of Sb is between $10^{17}$–$10^{20}$ cm$^{-3}$.

7. The light-emitting device according to claim 1, wherein at least one of the first region and the third region is devoid of Sb.

8. A light-emitting device, comprising:
   a substrate;
   an active layer formed on the substrate and comprising Sb; and
   a temperature coefficient (Tc) which is between −0.6%~−0.75%;
   wherein the temperature coefficient $(Tc)=\{[(L2\times100)/L1]-100\}/(T2-T1)$,
   wherein the light-emitting device has a first luminance (L1) at a first temperature (T1) and a second luminance (L2) at a second temperature (T2).

9. The light-emitting device according to claim 8, wherein the active layer comprises a first quantum well, a second quantum well and a barrier layer disposed between the first quantum well and the second quantum well.

10. The light-emitting device according to claim 9, wherein the barrier layer includes a first region adjacent to the first quantum well, a third region adjacent to the second quantum well, and a second region disposed between the first region and the third region and comprising Sb.

11. The light-emitting device according to claim 9, wherein a thickness of the barrier layer is between 50Å~250Å.

12. The light-emitting device according to claim 8, wherein a material of the active layer comprises AlGaAs, AlInGaP, InGaP, or AlInP.

13. The light-emitting device according to claim 8, wherein the second temperature is higher than the first temperature and the second luminance is less than the first luminance.

14. The light-emitting device according to claim 8, wherein the first temperature is between 20-40° C. and the second temperature is between 50-100° C.

* * * * *